United States Patent [19]

Bose

[11] Patent Number: 4,821,322
[45] Date of Patent: Apr. 11, 1989

[54] FM MULTIPLEX DECODING

[75] Inventor: Amar G. Bose, Wayland, Mass.

[73] Assignee: Bose Corporation, Framingham, Mass.

[21] Appl. No.: 90,051

[22] Filed: Aug. 12, 1987

[51] Int. Cl.$^4$ ............................................. H04H 5/00
[52] U.S. Cl. ..................................... 381/13; 455/214
[58] Field of Search .................... 381/3, 4, 5, 14, 13; 455/45, 214

[56] References Cited

U.S. PATENT DOCUMENTS

| | | | |
|---|---|---|---|
| 2,562,703 | 7/1951 | Dome | 381/4 |
| 3,534,172 | 10/1970 | Weeda | 381/4 |
| 3,787,629 | 1/1974 | Limberg | 381/5 |

Primary Examiner—Forester W. Isen
Attorney, Agent, or Firm—Charles Hieken

[57] ABSTRACT

Apparatus demodulates frequency-modulated information signals on a radio frequency signal carrying on a suppressed superaudio carrier signal, amplitude-modulated spectral components in a subcarrier channel frequency range above the audio frequency range and frequency modulated spectral components within the audio range. A demodulator demodulates the frequency-modulated information signals to provide detected audio signals having spectral components within the audio frequency range and detected superaudio signals having spectral components including those within the subcarrier channel frequency range above the audio frequency range in response to modulated radiated radio frequency signals arriving at the apparatus over a number of paths of different lengths. There is a reference signal source responsive to the detected superaudio signals that provides a reference signal of the frequency of the suppressed subcarrier characterized by a phase shift substantially the same as that imparted to the detected spectral components within the subcarrier channel frequency range. The reference signal is combined with the detected spectral components within the subcarrier channel frequency range to provide an audio signal.

8 Claims, 3 Drawing Sheets

FM MULTIPLEX DECODING

The invention relates to reducing audio distortion in reception of FM stereo broadcasts.

The transmitted stereo signal typically carries a sum signal corresponding to the sum of left and right audio signals, a 19 kHz pilot carrier and a difference signal balance modulated upon a 38 kHz suppressed carrier corresponding to the difference between the left and right signals. In stereo receivers circuitry demodulates a received FM stereo signal into these components. Circuitry doubles the demodulated 19 kHz pilot carrier to provide a 38 kHz reference signal that is mixed with the recovered balance modulated signal to provide the difference signal. The difference signal is then added to and subtracted from the sum signal to provide the left and right audio signals.

Audible distortions often occur when some transmitted radio frequency signals reach the stereo receiver over different pathlengths following reflection of some transmitted rays. It has been discovered that as the receiver moves through a multipath region, the change in strength and time delay of a reflected signal relative to the directly transmitted signal causes abrupt phase shifts between the 38 kHz reference signal doubled from the 19 kHz pilot signal and the recovered balance modulated difference signal. These abrupt phase shifts cause the apparent stereo soundstage perceived by a listener to expand and contract in width resulting in "pumping" or "constriction" of the perceived sound.

An article, by A. R. Moubayed, appearing on page 70 of the April 1986 issue of *Electronics & Wireless World*, describes a method for operating a phase-locked loop which makes the loop insensitive to regular sign changes in the input signal. A second article, by Kerim Fahme, on page 35 of the January 1987 issue of the same publication, adopts this method specifically for demodulating DSB-SC FM stereo signals.

The general approach in this publication is to use a PLL operating at twice the carrier frequency of the DSB-SC signal to be demodulated. The incoming DSB-SC signal is hard-limited using an asymmetric limiter. Thus, the limited signal has a duty cycle substantially less than fifty percent. When the incoming DSB-SC signal changes sign, which happens when the modulating audio passes through zero, the time of positive limiter output shifts from one 78 KHz period to the following period and with the same phase relation as before. Thus, the output of the PLL phase detector does not change, even though the input signal has changed signs.

According to the invention, there is means for preventing abrupt phase shifts between the reference signal and the recovered balance modulated signal. In one form of the invention, a transmitter transmits a pilot subcarrier at the same frequency as the suppressed subcarrier modulated with the difference signal.

According to another form of the invention, the transmitter transmits a pilot subcarrier at a frequency different from the suppressed subcarrier and the receiver includes means for detecting zero crossings of the received balance modulated difference signal to provide a phase control signal, and means responsive to the phase control signal for causing the reference signal to track phase changes in the received balance modulated signal.

Preferred embodiments of the invention include the following features. In order to correctly determine the phase of the pilot carrier, before demodulating the subcarrier, the pilot carrier is compared to a reference pilot carrier. The benefit of generating the pilot carrier from the subcarrier is that it insures that the phase of the two signals are the same.

In contrast to the prior art circuit described above, the present invention uses a PLL locked to the zero crossings of the DSB-SC signal. This approach overcomes two significant limitations of the Moubayed/Fahme circuit. The first is that the threshold of the asymmetric limiter in the prior art must accurately follow the level of the modulating audio, which places some very strict restrictions on the limiter construction and performance. If the threshold does not follow the modulating audio level, the duty cycle of the limiter output will vary with audio level, resulting in PLL carrier signal phase variations that will ultimately cause gain variations in the demodulated signal output. Secondly, the prior art approach is more sensitive to noise on the input signal than the approach of the invention, which rejects all the noise other than that occurring near the zero crossing.

Other advantages and features will become apparent from the following specification when read in connection with the accompanying drawing in which.

Figure 1:
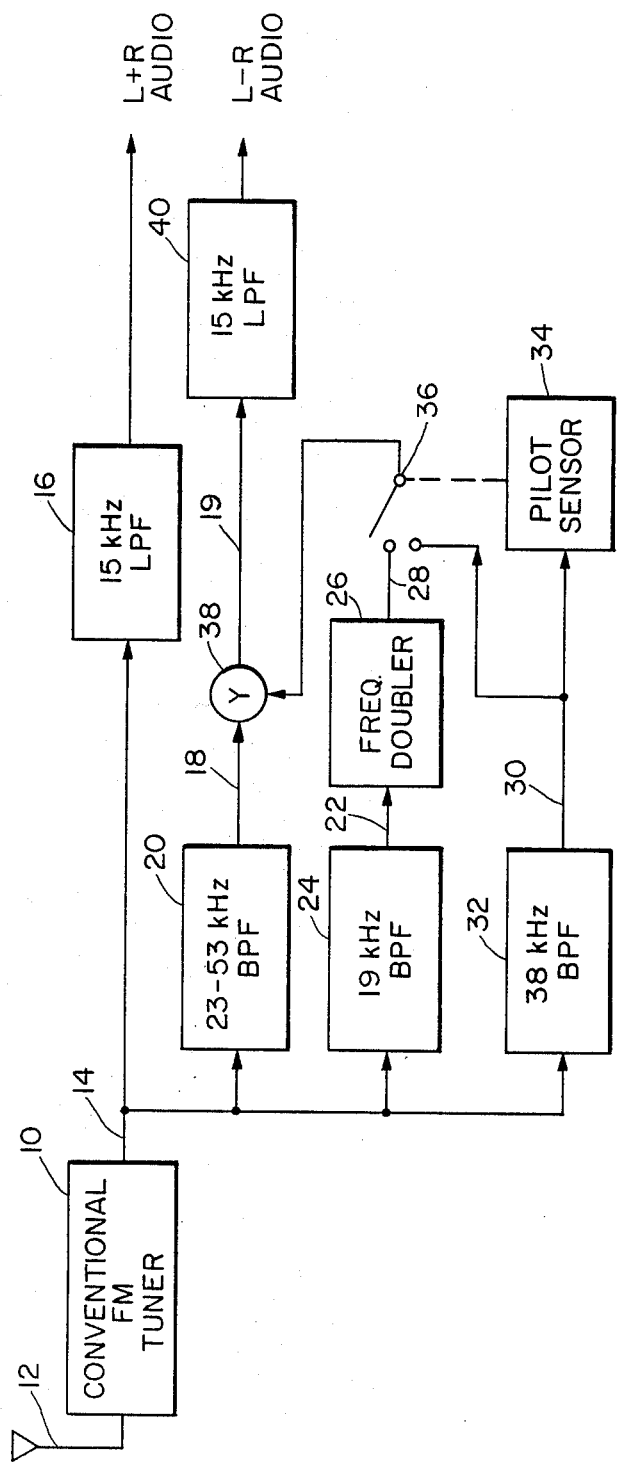
FIG. 1 is a block diagram of an FM multiplex decoding system embodying the present invention.

Referring to FIG. 1, a conventional FM tuner 10 demodulates an FM signal via an antenna 12 to provide a composite demodulated signal 14. This composite signal 14 is filtered to separate out its component parts. Low pass filter 16 having a cutoff frequency typically 15 kHz selectively transmits a main sum audio signal, L+R, which carries monophonic information.

Bandpass filter 20 having a passband between 23 and 38 kHz selectively transmits the received modulated difference signal 18 and 38 kHz narrow bandpass filter 32 selectively transmits the 38 kHz pilot carrier signal 30 as a reference signal to demodulator 38. Low pass filter 40 selectively transmits difference frequency components of the demodulated subcarrier signal 19 to provide the difference signal, L-R, for combining in conventional manner with the sum signal, L+R, to provide the left and right signals, L and R, respectively.

By broadcasting a 38 kHz pilot in addition to or instead of the conventional 19 kHz pilot carrier, phase shift distortion caused by transmission is reduced because both the received 38 kHz pilot carrier signal 30 and the received difference subcarrier modulated signal 18 receive corresponding phase shifts. Even if the transmitted 38 kHz pilot carrier frequency modulates the RF carrier by as much as 5%, the whole system signal-to-noise ratio drops by only about 0.5 decibels. Also broadcasting a 19 kHz pilot signal insures compatibility with prior art systems.

For compatibility with stations broadcasting a 19 kHz pilot carrier, the embodiment of FIG. 1 includes a 19 kHz narrow bandpass filter 24 for selectively transmitting the 19 kHz pilot carrier 22. As in conventional receivers, frequency doubler 26 doubles the 19 kHz pilot carrier 22 to provide the 38 kHz reference signal 28. 38 kHz pilot sensor 34 determines whether a 38 kHz pilot signal 30 has been received. If the 38 kHz pilot signal 30 is present, pilot sensor actuates switch 36 to couple the 38 kHz pilot carrier signal 30 as the reference signal mixer 38. If absent, switch 36 couples 38 kHz reference pilot carrier signal 28 as the reference signal to mixer 38.

Figure 2:
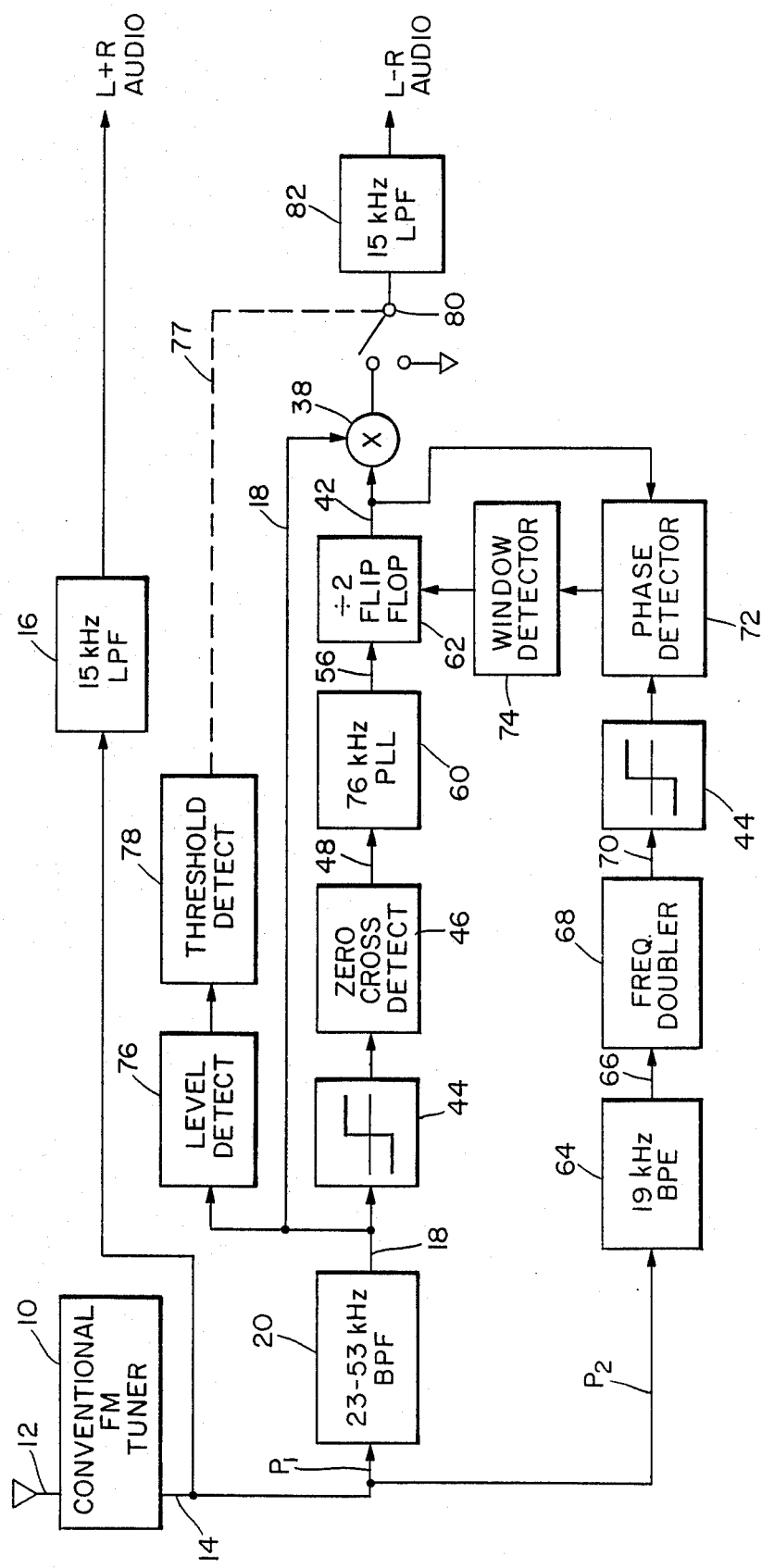
FIG. 2 is a block diagram of an alternative FM multiplex decoding system.

Referring to FIG. 2, there is shown a block diagram illustrating the logical arrangement of another embodiment of the invention which reduces multipath phase distortion when the transmitted pilot carrier is 19 kHz. 23–53 kHz bandpass filter 20 selectively transmits modulated difference signal 18 through hard limiter 44 to zero crossing detector 46 to provide a pulse 48 at each zero crossing of signal 18. These pulses correspond to the zero crossings 48 of the 38 kHz suppressed carrier and zero crossings caused by the original modulating difference audio signal. 76 kHz phase-locked loop 60 locks to the phase of the zero crossings of the 8 kHz suppressed carrier only.

Figure 3:
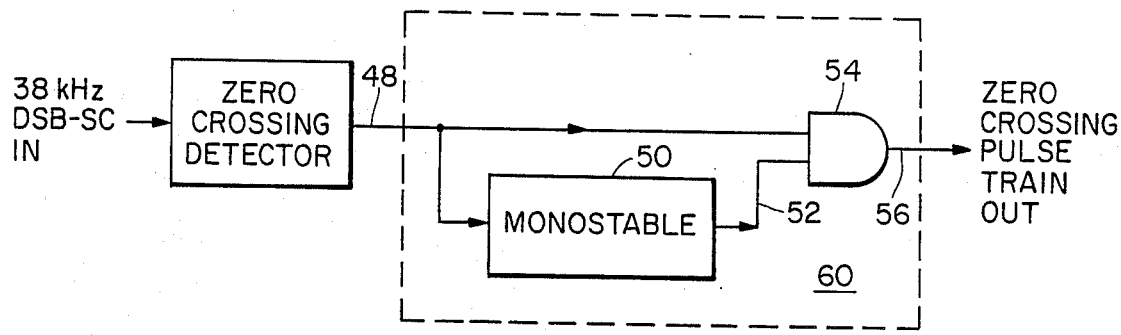
FIG. 3 is a schematic circuit diagram of a suitable phase-locked loop shown in FIG. 2.
Figure 4:
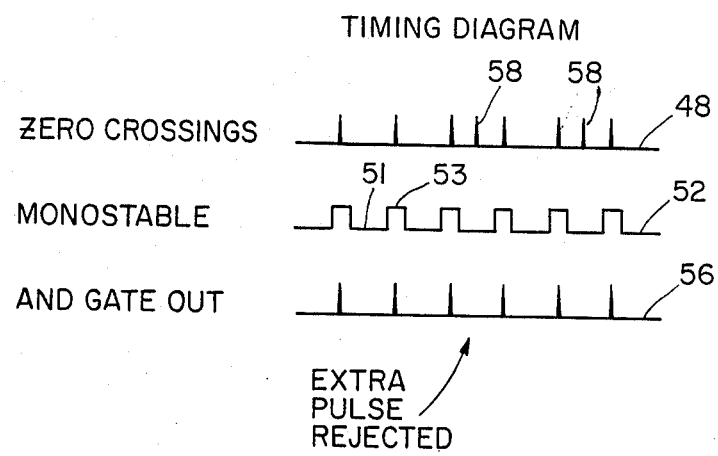
FIG. 4 is a timing diagram helpful in understanding the operation of the phase-locked loop shown in FIG. 3.

Referring to FIGS. 3 and 4, 76 kHz phase locked loop 60 typically comprises a monostable 50 having a period of slightly under half the period of the 38 kHz suppressed carrier, approximately 13 microseconds. Each zero crossing pulse 48 drives the monostable 50 to a low state 51 for slightly less than 13 microseconds, at which point it reverts to a high state 53. The output 52 of monostable 50 is fed to AND gate 54, along with the original zero crossing pulse train 48. ANDing these signals results in an output signal 56 of pulses separated by approximately half the period of the 38 kHz carrier. Odd pulses 58 caused by the modulating audio zero crossings, are thereby rejected.

If, at start up, or due to noise bursts, the monostable 50 incorrectly triggers on an odd pulse 58, the system will quickly return to synchronism with the 38 kHz carrier zero crossings because they occur much more frequently than odd pulses 58. Following an incorrect triggering by an odd pulse 58, the first 38 kHz carrier zero crossing would be incorrectly rejected, but the next carrier zero crossing would be accepted, restoring the system to synchronism with the 38 kHz suppressed carrier.

The output of phase-locked loop 60 feeds divider flip-flop 62 to provide 38 kHz reference signal 42 for mixing with the modulated difference signal 18 to provide the difference signal.

Incorrect triggering caused by start up or noise bursts may also incorrectly shift the phase of reference signal 42. In order to determine the correct phase of reference signal 42 and correct it if necessary, the demodulated signal from FM tuner 10 is also fed to 19 kHz bandpass filter 64 to provide 19 kHz pilot carrier signal 66 that is frequency doubled by frequency doubler 68 to provide a 38 kHz reference pilot carrier 70. The pilot carrier 70 is hard limited to form a 38 kHz square wave. Phase detector 72 compares the phase of this square wave signal with reference signal 56. If the phase difference between the two signals is within + or −90° then the phase of reference signal 56 is correct. If the phase difference is outside this window, window comparer 74 senses this condition and forces divide-by-two flip-flop 62 to have an extra transition. This extra transition changes the phase of reference signal 42 by 180°, in phase with the frequency doubled reference pilot carrier, ensuring correct decoding of the left and right signals.

When the level of the modulated difference signal drops below some threshold, as would happen when a normally mono audio program were being broadcast, level detector 76 senses this condition and provides a signal 77 which turns off the output of subcarrier demodulator 38 with switch 80. This circuitry causes a minimum of artifacts while eliminating the noise and other associated problems that occur when the phase-locked loop tries to lock to a low level or nonexistent signal. Although it is preferred that an electronically controlled switch is used, a voltage controlled attenuator may be used if that approach reduces audible artifacts.

Finally, the demodulated subcarrier signal is passed through 15 kHz low pass filter 82, and then to a conventional decoding matrix (not shown) which decodes both the sum, L+R, and difference, L-R, signals into the left and rights audio signals.

What is claimed is:

1. Apparatus for demodulating frequency-modulated information signals on a radio frequency signal carrying suppressed superaudio carrier signal, amplitude-modulated spectral components having an imparted random phase shift in a subcarrier channel frequency range above the audio frequency range and frequency modulated spectral components within the audio frequency range comprising, demodulating means for demodulating the frequency-modulated information signals to provide detected audio signals having spectral components within said audio frequency range and detected superaudio signals having spectral components including those within said subcarrier channel frequency range above said audio frequency range characterized by said imparted random phase shift in response to modulated radiated radio frequency signals arriving at said apparatus over a plurality of paths of different lengths, reference means responsive to said detected superaudio signals for providing a reference signal of the frequency of said suppressed carrier characterized by a phase shift substantially the same as said imparted random phase shift, and means for combining said reference signal with the detected spectral components within said subcarrier channel frequency range to provide an audio signal.

2. Apparatus in accordance with claim 1 and further comprising, transmitting apparatus for broadcasting said radio frequency signal with said frequency-modulated information signals, said transmitting means including means for frequency modulating said radio frequency signal with a pilot signal of frequency equal to that of said suppressed superaudio carrier signal, and said reference means includes means for detecting said pilot signal to provide said reference signal.

3. Apparatus in accordance with claim 1 wherein said reference means comprises means for detecting zero crossings of said amplitude modulated spectral components within said subcarrier channel frequency range, and locking means responsive to the detected zero crossings for providing said reference signal.

4. Apparatus in accordance with claim 3 wherein said locking means comprises a phase-locked loop in synchronism with said detected zero crossings.

5. Apparatus in accordance with claim 1 and further comprising, pilot carrier sensing means responsive to the frequency of a superaudio pilot carrier frequency-modulated on said radio frequency signal for providing a pilot signal representative of the frequency of the detected pilot carrier signal, and means responsive to said pilot signal for controlling said reference means.

6. Apparatus in accordance with claim 5 wherein said means for controlling includes switching means responsive to said pilot signal for providing said pilot carrier signal as said reference signal when the frequency of said pilot carrier signal is the same as that of said suppressed superaudio carrier signal.

7. Apparatus in accordance with claim 6 and further comprising, zero crossing detecting means for providing zero crossing signals representative of the occurrence of zero crossings of said amplitude modulated spectral components within said subcarrier channel frequency range, said switching means being responsive to the pilot signal representative of the pilot carrier signal being of frequency different from that of said suppressed superaudio carrier signal for responding to said zero crossing signals to provide said reference signal.

8. Apparatus in accordance with claim 7 and further comprising, a monostable multivibrator having an astable state for a duration less than half the period of said suppressed superaudio carrier signal, means for coupling said zero crossing detecting means to said monostable multivibrator to initiate said astable state in response to each detected zero crossing, an AND gate having one leg coupled to the output of said monostable multivibrator for being enabled during said astable state, and means for coupling the other leg of said AND gate to said zero crossing detector means to pass only zero crossing signals coincident with the occurrence of said astable state.

* * * * *